United States Patent [19]

Krumm et al.

[11] 4,353,040

[45] Oct. 5, 1982

[54] MULTI-LAYER MODULE WITH CONSTANT CHARACTERISTIC IMPEDANCE

[75] Inventors: Horst Krumm, Steinenbronn; Helmut Schettler, Dettenhausen; Rainer Stahl, Schoenaich; Rainer Zühlke, Leonberg, all of Fed. Rep. of Germany

[73] Assignee: International Business Machines Corporation, Armonk, N.Y.

[21] Appl. No.: 192,972

[22] Filed: Oct. 2, 1980

[30] Foreign Application Priority Data

Oct. 6, 1979 [DE] Fed. Rep. of Germany ....... 2940593

[51] Int. Cl.³ .............................................. H01P 3/00
[52] U.S. Cl. ........................................ 333/1; 333/236
[58] Field of Search ...................... 333/1, 236, 243; 174/117 F; 361/414, 416

[56] References Cited

U.S. PATENT DOCUMENTS 3,179,904 4/1965 Paulsen .................................. 333/1
3,459,879 8/1969 Gerpheide ........................ 333/1 X Primary Examiner—Paul L. Gensler
Attorney, Agent, or Firm—Theodore E. Galanthay

[57] ABSTRACT

Disclosed is a multi-layer module structure having a constant characteristic impedance. In each conductor line plane, two signal lines are arranged between a ground and a voltage supply line. This line sequence: ground/signal/signal/voltage supply line, is repeated several times in each conductor line plane. The spacing between the signal line and the adjacent ground and voltage supply line, respectively, is identical in each case. Adjacent conductor line planes, nth and (n+1)th have conductor lines arranged orthogonally. The lines of the nth and the (n+2)th plane are preferably staggered to each other such that when the nth plane is projected relative to the (n+2)th plane, the ground line of the (n+2)th plane is arranged in between the voltage supply lines (e.g. a voltage supply line and a ground line) of the nth plane.

7 Claims, 4 Drawing Figures

MULTI-LAYER MODULE WITH CONSTANT CHARACTERISTIC IMPEDANCE

DESCRIPTION

BACKGROUND OF THE INVENTION

1. Field of the Invention

The invention relates to a multi-layer module with constant characteristic impedance. Generally, such modules are made up of several layers of ceramic material, between which the conductor planes extend. These conductors may be signal lines, lines connected to ground or mass (which are subsequently referred to as ground lines) or lines to which an operating voltage is applied (which are subsequently referred to as voltage supply lines). The lines in the various layers are through-connected by so-called interconnecting vias extending through one or several layers.

2. Description of the Prior Art

One prior art structure as illustrated in FIG. 2, is a multi-layer module wherein signal line planes are arranged between a plane of ground lines and a plane of voltage supply lines. The conductors of two superposed signal line planes are arranged orthogonally to each other, to minimize the influence the lines exert on each other.

Another prior art structure wherein the voltage supply and signal lines are arranged in one plane is described in IBM TDB Vol. 20, No. 8, p. 3092, 1978. Three signal lines each are interleaved between two voltage supply lines. In the TDB article it is also pointed out that if several line planes are used, two lines corresponding to each other have to be diagonally displaced to minimize cross-sectional noise coupling.

The known arrangements described above have the disadvantage that they are unsuitable for high signal sequences (maximum switching speed of electronic components), because the characteristic impedances of the individual signal lines are of different magnitudes, so that the mismatching which is bound to occur with regard to the circuits connected to the multi-layer modules leads to reflections of different intensities, which in turn affect or preclude high-speed optimum signal transmission.

SUMMARY OF THE INVENTION

A constant characteristic impedance is provided in each conductor plane by placing two parallel signal lines between a ground line and a voltage supply line. This placement pattern is repeated throughout each conductor plane, with equidistant spacing between signal lines and adjacent ground and voltage supply lines.

Each conductor plane is on one ceramic layer in a multi-layer ceramic module structure. Conductor lines in adjacent first and second planes (n and n+1) are orthogonally aligned. In a third plane (n+2), adjacent to the second plane (n+1), the conductor lines are parallel to the conductor lines in the first plane (n) and staggered by half the line distance, thereby placing each ground line in the third plane (n+2) half-way between a voltage supply and ground line in the first plane (n). The fourth plane (n+3), adjacent the third plane (n+2) is staggered with respect to the second plane (n+1) also by half the line distance. In this way, conductor lines in the fifth plane (n+4), adjacent the fourth plane (n+3), will be aligned with conductors in the first plane (n).

Connecting vias between conductors of adjacent planes are provided at the intersection of corresponding voltage supply and ground conductor lines. Unused signal lines are connected to ground.

Another feature of this invention is the symmetrical spacing of lines in different planes. The spacing between planes is arranged so that the distance between a signal line in one plane (e.g. plane n) and its associated ground line in another plane (e.g. plane n+2) will be equal to the spacing between conductor lines in the one plane.

BRIEF DESCRIPTION OF THE DRAWINGS

The foregoing and other objects, features and advantages of this invention will be apparent from the following and more detailed description of a preferred embodiment of the invention as illustrated in the accompanying drawings.

DESCRIPTION OF THE PREFERRED EMBODIMENTS

Figure 1A:
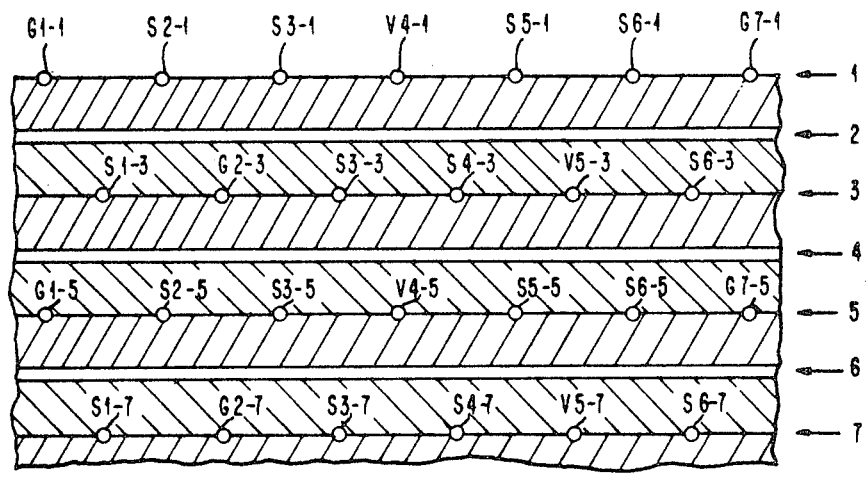
FIG. 1A is a schematic sectional representation of a multi-layer module with a constant characteristic impedance.

Refer now to FIG. 1A which is a sectional representation of a multi-layer ceramic module with a constant characteristic impedance. The conductors in the individual planes are arranged orthogonally to each other. The conductor planes are designated as 1 to 7. It is assumed that all conductors have the same cross-section and that the conductors in the different planes are equidistantly spaced from each other. The ground lines are designated as G, the signal lines as S and the voltage supply lines as V. In a plane, two adjacent signal lines each are interleaved between a ground line and a voltage supply line. Thus, in plane 1, ground line G1-1 is followed by signal lines S2-1 and S3-1, voltage supply line V4-1, signal lines S5-1 and S6-1, and ground line G7-1.

Figure 1B:
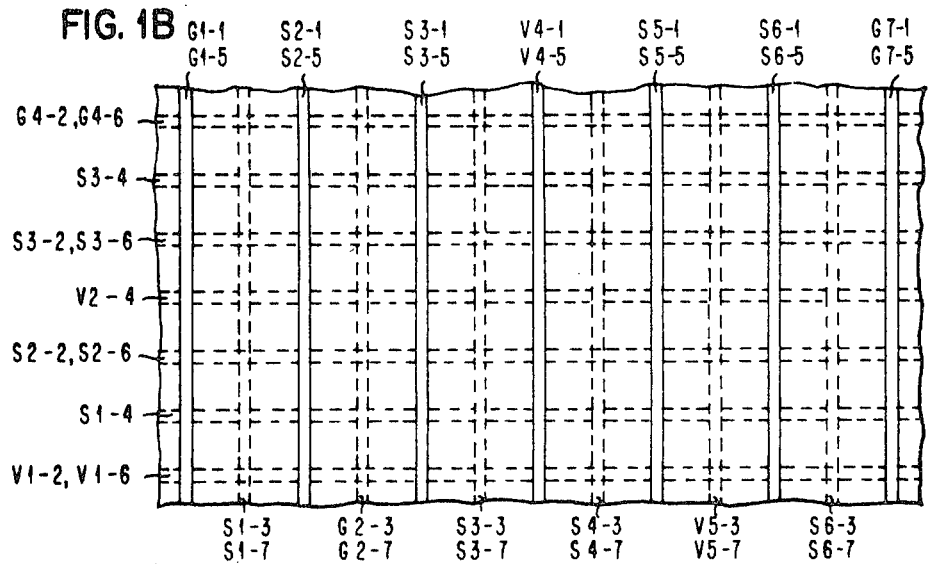
FIG. 1B is a plan view of a multi-layer module in accordance with FIG. 1A.

With continued reference to FIG. 1A, also refer to FIG. 1B, which is a top view of the section of FIG. 1A. In accordance with FIG. 1B, the line sequence in the second line plane arranged underneath the first is as follows: Voltage supply line V1-2, signal line S2-2, signal line S3-2, and ground line G4-2. The lines of the first and the second plane are arranged orthogonally to each other. The lines in the third plane 3 extend parallel to those in the first plane 1. However, the lines of the third plane are staggered by half a line spacing relative to those in the first plane. Thus, in accordance with a corresponding horizontal projection, the signal line S1-3 of the third plane is arranged between the lines G1-1 and S2-1 of the first plane, and the ground line G2-3, following line S1-3, is arranged between the signal lines S2-1 and S3-1 of the first plane, etc.

In the third signal plane 3, the lines follow each other as illustrated in FIG. 1A: Signal line S1-3, ground line G2-3, signal line S3-3, signal line S4-3, voltage supply line V5-3, signal line S6-3. The sequence of the lines in the fourth plane is S1-4, V2-4, S3-4 as shown in FIG. 1B. These lines are staggered relative to those in plane 2 by half a line spacing.

The lines in the fifth plane G1-5, S2-5, S3-5, V4-5, S5-5, S6-5, and G7-5 are aligned to lines G1-1 to G7-1 in the first plane, whereas the lines in the seventh plane S1-7, G2-7, S3-7, S4-7, V5-7, and S6-7 are again staggered by half a line spacing relative to those in the fifth plane. Analogously, lines V1-6, S2-6, S3-6, and G4-6 in the sixth plane are arranged underneath the lines of the second plane.

This arrangement of the lines, the interleaving of two signal lines between a ground line and a voltage supply line, as well as the staggering of the lines in two corresponding line planes (e.g. plane 1 / plane 3 or plane 3 / plane 5 or plane 5 / plane 7) by half a line spacing leads to a uniform symmetrical alignment of the signal lines to the ground and the voltage supply lines, respectively, and thus to a constant characteristic impedance.

The constant characteristic impedance which is adapted to the electronic circuits to be connected to the multi-layer modules eliminates detrimental reflections, i.e., the arrangement described can be used for very high signal sequences and thus for circuits with minimum switching times.

Figure 2:
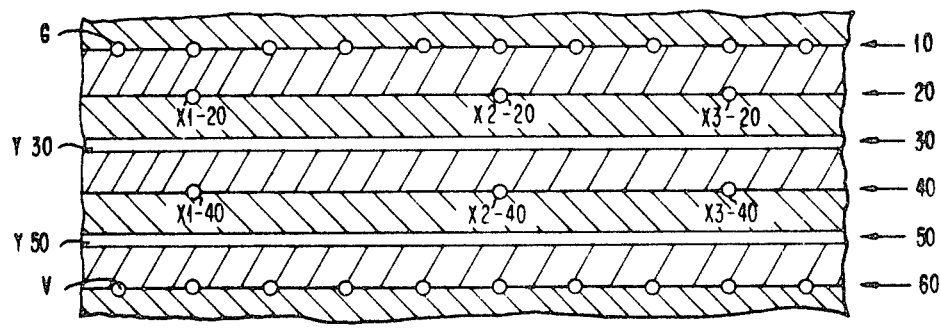
FIG. 2 is a schematic sectional view of a prior art multi-layer ceramic module.

FIG. 2 shows a known prior art arrangement. In this sectional representation of a multi-layer module, the signal line planes 20, 30, 40 and 50 are interleaved between a ground line plane 10 and a voltage supply line plane 60 (the individual ground lines are designated as G and the individual voltage supply lines as V). The lines of planes 30 and 50 extend orthogonally to those in planes 20 and 40. The signal lines of plane 20 are designated as X1-20, X2-20 and X3-20, those in plane 40 as X1-40, X2-40 and X3-40, those in plane 30 as Y-30, and those in plane 50 as Y-50. With this arrangement, the signal lines are not uniformly symmetrically aligned to the ground and voltage supply lines, so that the characteristic impedance of the individual signal lines is not constant either. Therefore, such an arrangement is not suitable for minimum switching times.

Although the embodiment of FIGS. 1A and 1B illustrate an equidistant spacing of the lines in the individual planes, this does not mean that a non-equidistant spacing is not equally feasible. Configurations are conceivable wherein the spacing of adjacent signal lines exceeds that between one of these signal lines and its neighboring ground and voltage supply lines, respectively. With such a configuration it is essential, however, that the spacing between a signal line and its neighboring ground and voltage supply line, respectively, is invariably the same. For example, the distance between G1-1 and S2-1 must equal the distance between S3-1 and V4-1.

With regard to the conditions of symmetry of the lines in one plane and the lines of different planes, it is pointed out that a signal line and its adjacent ground and voltage supply line, respectively, are coupled. This coupling may exist between the lines of one plane as well as between the lines of the nth and (n+2)th line plane, say, between S2-1 and G2-3. The greater coupling is decisive for the transmission characteristics. Assuming that coupling were to occur between the lines in one plane, then the following conditions of symmetry would apply: The spacing between the signal line, say, S3-5 of the fifth plane, and its adjacent voltage supply line V4-5 must be the same as that between the signal line S2-5 and its adjacent ground line G1-5.

Other conditions of symmetry apply if the coupling between the lines of the nth and the (n+2)th plane is greater and thus is the decisive coupling between the lines in a plane. In other words (FIG. 1A), the spacing between, say, the signal lines S2-5 and S3-5 of the fifth plane and the ground line G2-3 in the third plane is to be identical, so that the signal lines and the ground line G2-3 are symmetrically aligned to each other. Such symmetry is essential for the characteristic impedance. In special cases, the conditions of symmetry can be extended to the lines in a plane as well as to the lines in the nth and the (n+2)th plane. This special case would occur if the couplings of the lines in a plane and the lines in the different planes mentioned above are the same. In such a case the spacing of the individual line planes must be chosen in such a manner that, for example, the spacing between the signal line S3-5 and its adjacent voltage supply line V4-5 is the same as that between the signal line S3-3 and the voltage supply line V4-5.

The through-connecting of the conductor planes will now be described. Upon the occurrence of a signal current on a signal line (regardless of whether this is in one plane or in different planes, the signal lines of which are through-connected to each other), it is necessary in the interest of satisfactory transmission characteristics to ensure that the signal current is fed back close to the signal line path via a ground and a voltage supply line, respectively, (high frequency conditions). By way of example, it is assumed that the decisive coupling exists between a signal line in the nth plane and a ground line of the (n+2)th plane. To ensure, from a circuit standpoint, that the signal current is fed back through the latter ground line, special contacting measures are taken.

Figure 3:
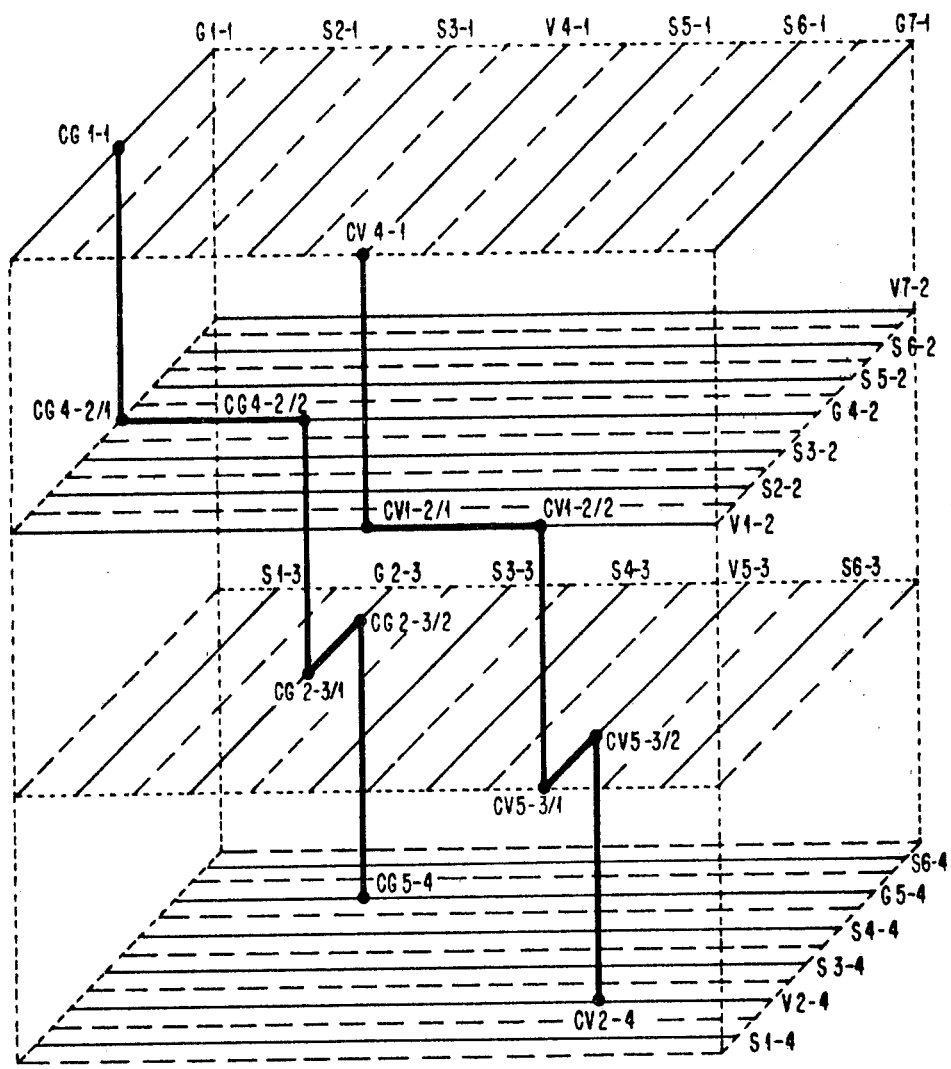
FIG. 3 is a perspective auxiliary representation of the conductor paths in 4 planes.

As may be seen from FIG. 1B in conjunction with FIG. 1A, and referring also to FIG. 3, the voltage supply lines and the ground lines, respectively, of the individual planes are through-connected in accordance with FIG. 3. Through-connection follows the principle that the ground lines of the nth and the (n+1)th plane are through-connected. This applies in analogy to the voltage supply lines, etc. The further through-connection to the ground line of the third plane G2-3 must be staggered to the first through-connection. This staggering can be effected on both sides of the connecting point resulting from connecting a corresponding line of the nth to the (n+1)th plane.

EXAMPLE

FIG. 3 is a perspective schematic view of the through-connections of four conductor planes. The first plane comprises the lines G1-1, S2-1, S3-1, V4-1, S5-2, S6-1, G7-1; the second plane the lines V1-2, S2-2, S3-2, G4-2, S5-2, S6-2, V7-2; the third plane the lines S1-3, G2-3, S3-3, S4-3, V5-3, S6-3, and the fourth plane the lines S1-4, V2-4, S3-4, S4-4, G5-4, S6-4. The ground lines are again designated as G, the signal lines as S and the voltage supply lines as V. The lines of the first (top) plane and the third, second and fourth plane, respectively, are staggered to each other by half a line spacing. For clarity's sake, additional broken lines, serving as a raster for half the line spacing, are shown in all planes. The through-connections are marked by heavier lines than the actual lines; the connecting points are schematically represented by small circles. The ground line G1-1 of the first plane is through-connected to the ground line G4-2 of the second plane at the points CG1-1 and CG4-2/1. The ground line G4-2 of the second plane is through-connected at point CG4-2/2 to the ground line G2-3 of the third plane at point CG2-3/1. This ground line G2-3 in turn is connected at point CG2-3/2 to the ground line G5-4 of the fourth plane at point CG5-4. Analogously, the voltage supply line V4-1 is through-connected to V1-2, V5-3 and V2-4 via connecting points CV4-1, CV1-2/1, CV1-2/2, CV5-3/1, CV5-3/2, and CV2-4.

An example of the two possibilities of vertically staggering the through-connections is shown at point CV1-2/1. In accordance with FIG. 3, the connecting point CV1-2/2 is on the right of the former point CV1-2/1; it may just as well be on the left of that point.

This kind of contacting which can be effected at all crossings of the ground and voltage supply lines, respectively, of two adjacent planes leads to a relatively close-mesh structure. It ensures that a signal current is fed back in close proximity to a correspondingly activated signal line. As the inductance of the signal line is determined by the surface integral between the signal and the feedback line and the feedback line extends in close proximity to the signal line, the resulting inductances are small, which is advantageous for signal transmission.

While the invention has been shown and particularly described with reference to preferred embodiments, it will be understood by those skilled in the art that various changes in form and detail may be claimed therein without departing from the spirit and scope of the invention.

We claim:

1. A multi-layer module with several conductor line planes extending parallel to each other, conductor lines of adjacent superposed planes being orthogonally aligned to each other, the conductor lines in each plane comprising:
    two signal lines being arranged between a ground line and a voltage supply line;
    an additional two signal lines arranged between said voltage supply line and an additional ground line;
    other conductor lines arranged in the same sequence of ground line, two signal lines. voltage supply line, and two additional signal lines, consecutively repeated in sequence; and
    the spacing between each said signal line and its adjacent ground or voltage supply line being identical in each case.

2. A multi-layer module as in claim 1 wherein the conductor lines in each plane are spaced equidistantly from each other such that the spacing between a ground line, an adjacent first signal line, a second signal line adjacent said first signal line, and a voltage supply line adjacent said second signal line are all equally spaced from each other.

3. A multi-layer module with several conductor line planes extending parallel to each other, comprising:
    two signal lines being arranged between a ground line and a voltage supply line;
    an additional two signal lines arranged between said voltage supply line and an additional ground line;
    other conductor lines arranged in the same sequence of ground line, two signal lines, voltage supply line, and two additional signal lines, consecutively repeated in sequence;
    the conductor lines of first and second adjacent planes being orthogonally aligned to each other;
    the conductor lines of a third plane being orthogonally arranged with respect to said second plane and staggered with respect to the conductor lines in the first plane such that when the first plane is projected relative to the third plane, the ground line of the third plane is arranged between two signal lines of said first plane.

4. A multi-layer module as in claim 3 wherein the conductor lines in each plane are spaced equidistantly from each other such that the spacing between a ground line, an adjacent first signal line, a second signal line adjacent said first signal line, and a voltage supply line adjacent said second signal line are all equally spaced from each other.

5. A multi-layer module as in claim 3 further comprising:
    through connections between adjacent planes connecting corresponding ground and voltage supply lines, respectively, at intersections thereof.

6. A multi-layer module as in claim 5 wherein unused signal lines are connected to ground lines.

7. A multi-layer module as in claim 3 wherein the spacing between planes is such that the spacing of conductor lines in one plane corresponds to the spacing between a signal line in a first plane and its associated ground line in another plane.

* * * * *